United States Patent
Liu (10) Patent No.: US 10,813,245 B2
(45) Date of Patent: Oct. 20, 2020

(54) APPARATUS CASE WITH A ROTATABLE AIRFLOW-BLOCKING PORTION AND SERVER THEREWITH

(71) Applicant: Wistron Corporation, New Taipei (TW)

(72) Inventor: Chia-Hsin Liu, New Taipei (TW)

(73) Assignee: Wistron Corporation, New Taipei (TW)

( * ) Notice: Subject to any disclaimer, the term of this patent is extended or adjusted under 35 U.S.C. 154(b) by 81 days.

(21) Appl. No.: 16/234,608

(22) Filed: Dec. 28, 2018

(65) Prior Publication Data
US 2020/0060042 A1 Feb. 20, 2020

(30) Foreign Application Priority Data

Aug. 16, 2018 (TW) .............................. 107128547 A (51) Int. Cl.
*H05K 7/20* (2006.01)
*H05K 5/02* (2006.01)

(52) U.S. Cl.
CPC ..... *H05K 7/20145* (2013.01); *H05K 7/20718* (2013.01); *H05K 5/0291* (2013.01)

(58) Field of Classification Search
CPC .......... H05K 7/20145; H05K 7/20718; H05K 5/0291; H05K 7/20727; H05K 7/20181; H05K 7/20563
See application file for complete search history.

(56) References Cited

U.S. PATENT DOCUMENTS

| | | | | |
|---|---|---|---|---|
| 6,396,685 B1* | 5/2002 | Chien | ..................... | G06F 1/184 312/223.2 |
| 6,409,518 B1* | 6/2002 | Hung | ..................... | G06F 1/184 361/801 |
| 6,415,923 B1* | 7/2002 | Chen | ..................... | B25H 3/003 206/372 |
| 6,870,744 B2* | 3/2005 | Kosugi | ................... | G06F 1/184 211/41.17 |
| 6,970,363 B2* | 11/2005 | Bassett | .................. | G06F 1/184 211/41.17 |
| 7,679,898 B2* | 3/2010 | Peng | ..................... | G06F 1/182 361/679.37 |

(Continued)

FOREIGN PATENT DOCUMENTS

CN 107769605 A 3/2018
TW 200644779 12/2006

*Primary Examiner* — Daniel P Wicklund
*Assistant Examiner* — Sagar Shrestha
(74) *Attorney, Agent, or Firm* — Winston Hsu (57) ABSTRACT

An apparatus case includes a first casing member, a second casing member, a driving portion, a blocking portion, and a rotary shaft. The first casing member and the second casing member are detachably engaged with each other. The driving portion is disposed on the first casing member. The blocking portion and the rotary shaft are rotatably disposed on the second casing member and connected with each other. A server includes the apparatus case and a circuit board disposed on the first casing member of the apparatus case. When the second casing member moves from a first position to a second position relative to the first casing member, the driving portion drives the rotary shaft to rotate so that the rotary shaft drives the blocking portion to rotate above an expansion slot of the circuit board.

20 Claims, 8 Drawing Sheets

(56) References Cited

U.S. PATENT DOCUMENTS

| | | | | |
|---|---|---|---|---|
| 7,843,698 B2* | 11/2010 | Takizawa | G06F 1/181 | 361/732 |
| 8,016,108 B1* | 9/2011 | Hung | B25H 3/023 | 206/372 |
| 8,149,578 B2* | 4/2012 | Neumann | G06F 1/20 | 361/690 |
| 8,353,746 B2* | 1/2013 | Tsai | G06F 1/20 | 454/284 |
| 8,395,892 B2* | 3/2013 | Li | H05K 7/20727 | 165/80.3 |
| 8,776,833 B2* | 7/2014 | Zhang | G06F 1/20 | 138/178 |
| 8,811,009 B2* | 8/2014 | Chen | H05K 7/20145 | 165/80.1 |
| 9,207,721 B2* | 12/2015 | Conn | G06F 1/181 | |
| 9,696,769 B1* | 7/2017 | Hamilton | H05K 7/20127 | |
| 2005/0056560 A1* | 3/2005 | Chen | B25H 3/003 | 206/373 |
| 2009/0321047 A1* | 12/2009 | Chen | G06F 1/203 | 165/80.3 |
| 2010/0105313 A1* | 4/2010 | Tsai | G06F 1/20 | 454/284 |
| 2010/0165568 A1* | 7/2010 | Tsai | H01L 23/467 | 361/679.49 |
| 2011/0103005 A1* | 5/2011 | Neumann | G06F 1/20 | 361/679.46 |
| 2011/0127895 A1* | 6/2011 | Conn | H05K 5/02 | 312/294 |
| 2012/0020013 A1* | 1/2012 | Li | G06F 1/20 | 361/679.47 |
| 2012/0115411 A1* | 5/2012 | Chan | G06F 1/20 | 454/333 |
| 2012/0155021 A1* | 6/2012 | Wei | H05K 7/20727 | 361/690 |
| 2013/0148290 A1* | 6/2013 | Chen | G06F 1/20 | 361/679.46 |
| 2013/0163199 A1* | 6/2013 | Chen | H05K 7/20145 | 361/690 |
| 2015/0011149 A1* | 1/2015 | Chu | G06F 1/203 | 454/184 |
| 2015/0069897 A1* | 3/2015 | Chen | H05K 5/0239 | 312/326 |
| 2016/0073537 A1* | 3/2016 | Tseng | G06F 1/187 | 361/809 |

\* cited by examiner

APPARATUS CASE WITH A ROTATABLE AIRFLOW-BLOCKING PORTION AND SERVER THEREWITH

BACKGROUND OF THE INVENTION

1. Field of the Invention

The present invention relates to a server, and more particularly to an apparatus case of a server.

2. Description of the Prior Art

As cloud applications develop, the demand for the performance of various electronic apparatus is increasing. The heat-dissipation efficiency of the systems is required to be increased as well. For this issue, the servers are usually provided with fans that generate airflow for dissipating heat from interior components of the server. For effective heat dissipation, the arrangement for the airflow inside the server needs to be devised, e.g. using flow-guiding structure. In practice, the disposition of the interior components of the server also affects the effect of the arrangement for the airflow. For example, when some electronic component is detached, the flow rate where the some electronic component was installed increases while the flow rate elsewhere decreases. This results in that the heat dissipation efficiency of the arrangement for the airflow deviates from its original design, which may induce insufficient heat dissipation to the server.

SUMMARY OF THE INVENTION

The present disclosure provides an apparatus case, which uses a rotatable airflow blocking portion for reducing the influence of an absence of an electronic component in the apparatus case on the arrangement for airflow in the apparatus case.

An apparatus case according to an embodiment includes a first casing member, a second casing member, a driving portion, a blocking portion, and a rotary shaft. The first casing member and the second casing member are detachably engaged with each other. The driving portion is disposed on the first casing member. The blocking portion is rotatably disposed on the second casing member. The rotary shaft is rotatably disposed on the second casing member and connected to the blocking portion. Therein, the second casing member has a first position and a second position relative to the first casing member. When the second casing member moves from the first position to the second position, the driving portion drives the rotary shaft to rotate so that the rotary shaft drives the blocking portion to rotate. Thereby, in practice, the apparatus case can accommodate a circuit board therein. The circuit board has an expansion slot. The blocking portion corresponds to the expansion slot. The blocking portion rotates above the expansion slot when driven by the rotary shaft. If there is no expansion card inserted in the expansion slot, the rotated blocking portion can retard airflow into the space above the expansion slot, so as to reduce the influence of the absence of the expansion card inserted in the expansion slot on the arrangement for the airflow in the apparatus case.

The present disclosure also provides a server, of which an apparatus case uses a rotatable airflow blocking portion for reducing the influence of an absence of an electronic component of the server on the arrangement for airflow in the apparatus case.

A server according to an embodiment includes an apparatus case and a circuit board. The apparatus case includes a first casing member, a second casing member, a driving portion, a blocking portion, and a rotary shaft. The first casing member and the second casing member are detachably engaged with each other. The driving portion is disposed on the first casing member. The blocking portion is rotatably disposed on the second casing member. The rotary shaft is rotatably disposed on the second casing member and connected to the blocking portion. The circuit board is disposed on the first casing member of the apparatus case and includes an expansion slot. Therein, the second casing member has a first position and a second position relative to the first casing member. When the second casing member moves from the first position to the second position, the driving portion drives the rotary shaft to rotate so that the rotary shaft drives the blocking portion to rotate above the expansion slot. Thereby, if there is no expansion card inserted in the expansion slot, the rotated blocking portion can retard airflow into the space above the expansion slot, so as to reduce the influence of the absence of the expansion card inserted in the expansion slot on the arrangement for the airflow in the apparatus case.

These and other objectives of the present invention will no doubt become obvious to those of ordinary skill in the art after reading the following detailed description of the preferred embodiment that is illustrated in the various figures and drawings.

DETAILED DESCRIPTION

Please refer to FIG. 1 to FIG. 4. A server 1 according to an embodiment includes an apparatus case 12 and a circuit board 16 disposed in the apparatus case 12. The apparatus case 12 includes a first casing member 122, a second casing member 124, a driving portion 126 (shown in hidden lines in FIG. 3), a plurality of blocking portions 128, and a rotary shaft 130. The first casing member 122 and the second casing member 124 are detachably engaged with other to form an accommodating space 12a. The driving portion 126 is disposed on the first casing member 122. The rotary shaft 130 and the plurality of blocking portions 128 are rotatably disposed on the second casing member 124. The rotary shaft 130 is connected to the plurality of blocking portions 128 so as to drive the blocking portions 128 to rotate. In the embodiment, the second casing member 124 is realized by a cover 1242 and a support frame 1244 connected to the cover 1242 in principle. The rotary shaft 130 and the plurality of blocking portions 128 are disposed on the support frame 1244. This structural configuration is conducive to the assembly of the rotary shaft 130 and the plurality of blocking portions 128 to the second casing member 124 and also can show an artistic appearance and avoid unexpected structural interference between the rotary shaft 130 and the blocking portion 128 with other components in the apparatus case 12; however, the second casing member 124 is not limited thereto in practice. For example, the rotary shaft 130 and the plurality of blocking portions 12 are disposed on the cover 1242. For this case, the support frame 1244 can be omitted. For another example, the cover 1242 and the support frame 1244 are formed in a single part, e.g. by pressing a metal plate. The circuit board 16 is disposed on the first casing member 122 and includes a plurality of expansion slots 162. Each expansion slot 162 can receive an expansion card 164 (for example but not limited to a PCIe card). In the embodiment, the circuit board 16 can be but limited to a system main board, on which a processor and other required electronic components (which are shown in the figures for simplification of drawing). Some of the expansion slots 162 do not receive expansion cards. Furthermore, in practice, the apparatus case 12 will accommodate other electronic components or devices (e.g. a heat dissipation system, storage, and so on), which are not shown in the figures for simplification of drawing. During an engagement of the first casing member 122 with the second casing member 124, the rotary shaft 130 engages with the driving portion 126 so as to make the rotary shaft 130 rotate relative to the second casing member 122 and drive the blocking portion 128 to rotate relative to the second casing member 122 in the accommodating space 12a, which will be described in details in the following. After the first casing member 122 and the second casing member 124 engaged, the plurality of blocking portions 128 and the expansion slots 162 are disposed correspondingly. During the engagement of the first casing member 122 with the second casing member 124, the rotary shaft 130 drives the blocking portions 128 to rotate above the corresponding expansion slots 162. Furthermore, the expansion slot 162 corresponding to the location of the cutting plane of FIG. 2 does not receive any expansion card.

Figure 3:
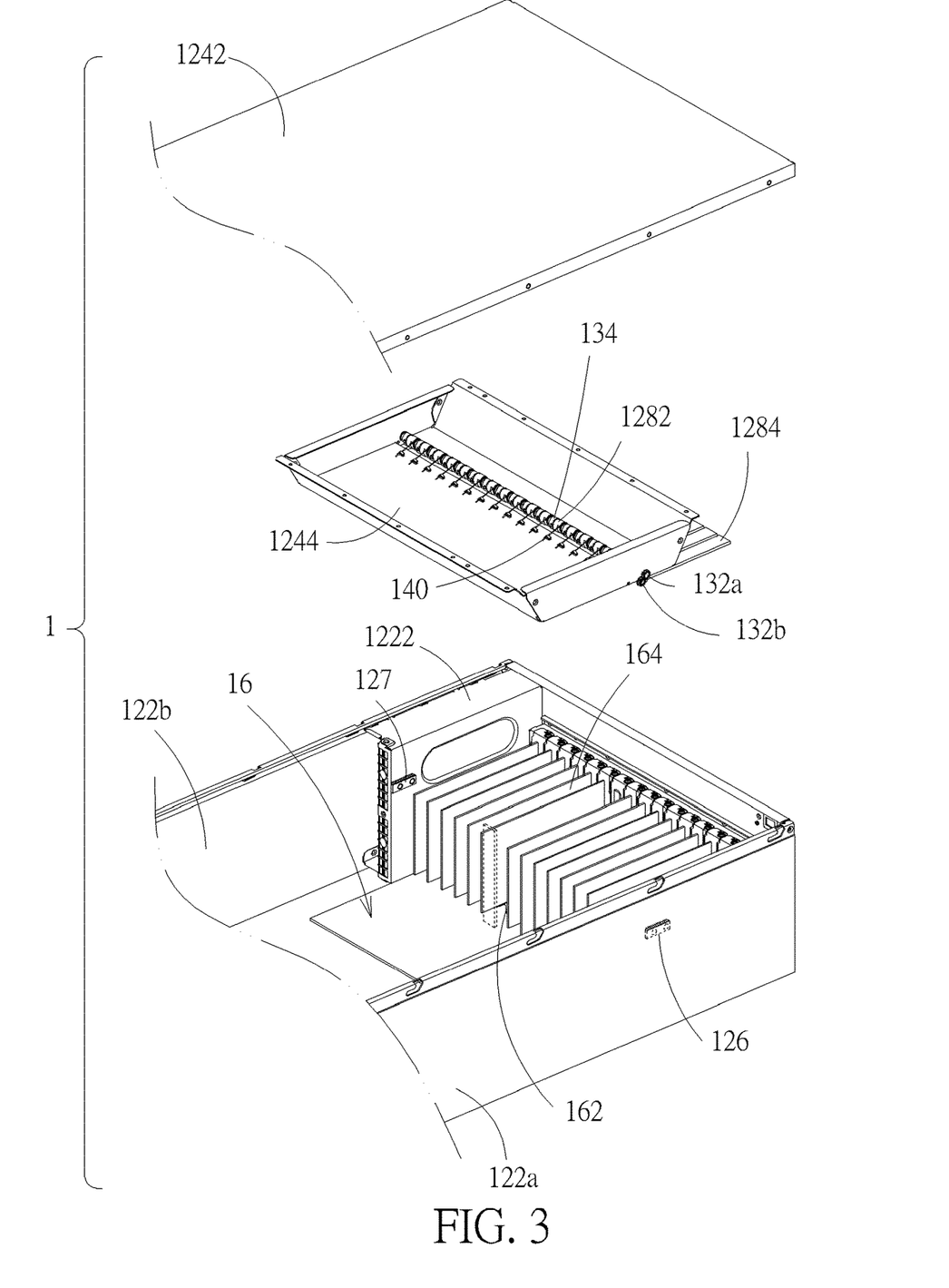
FIG. 3 is a partially exploded view of the server in FIG. 1.
Figure 4:
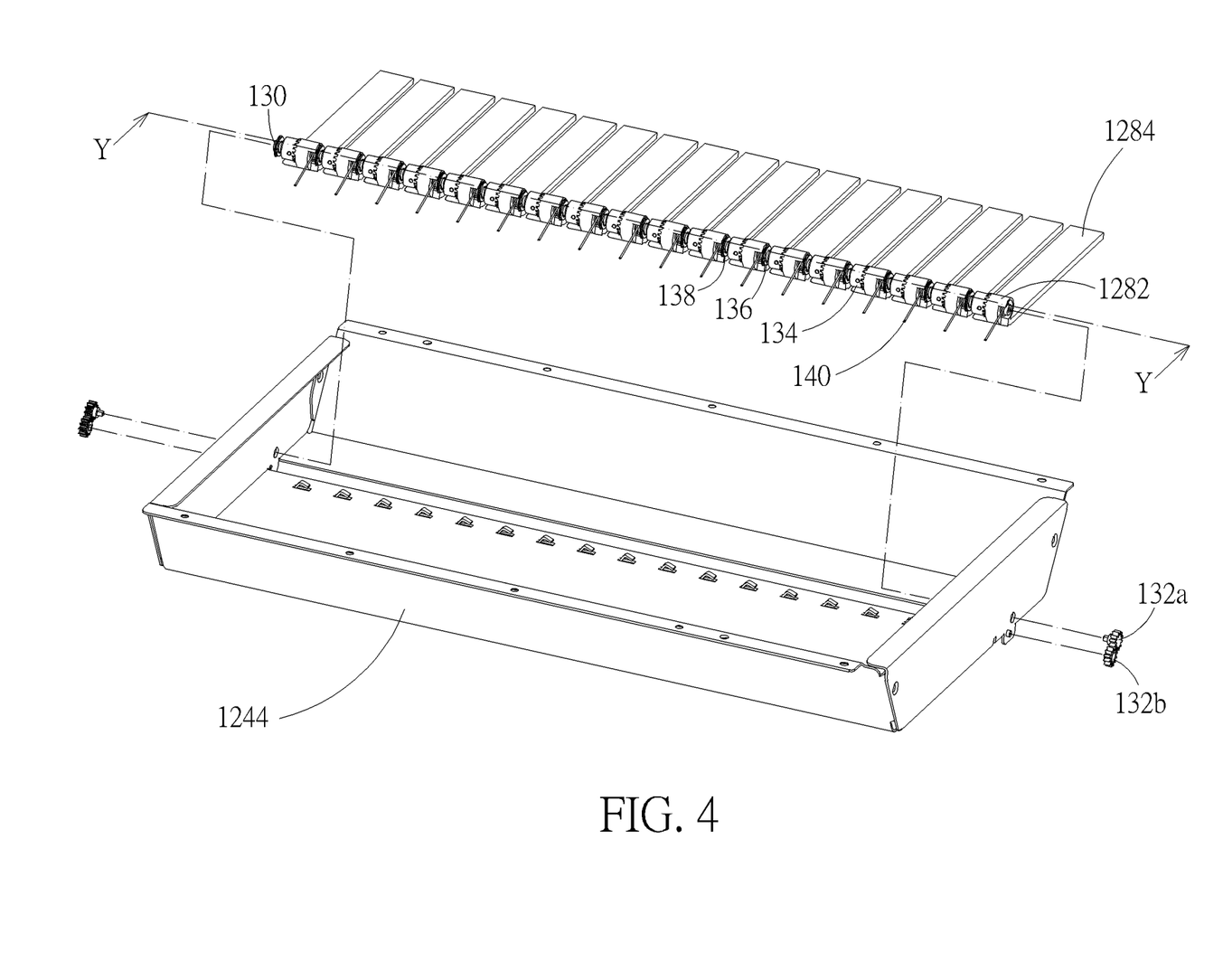
FIG. 4 is a partially exploded view of a second casing member, a blocking portion, and a rotary shaft of the server in FIG. 3.
Figure 5:
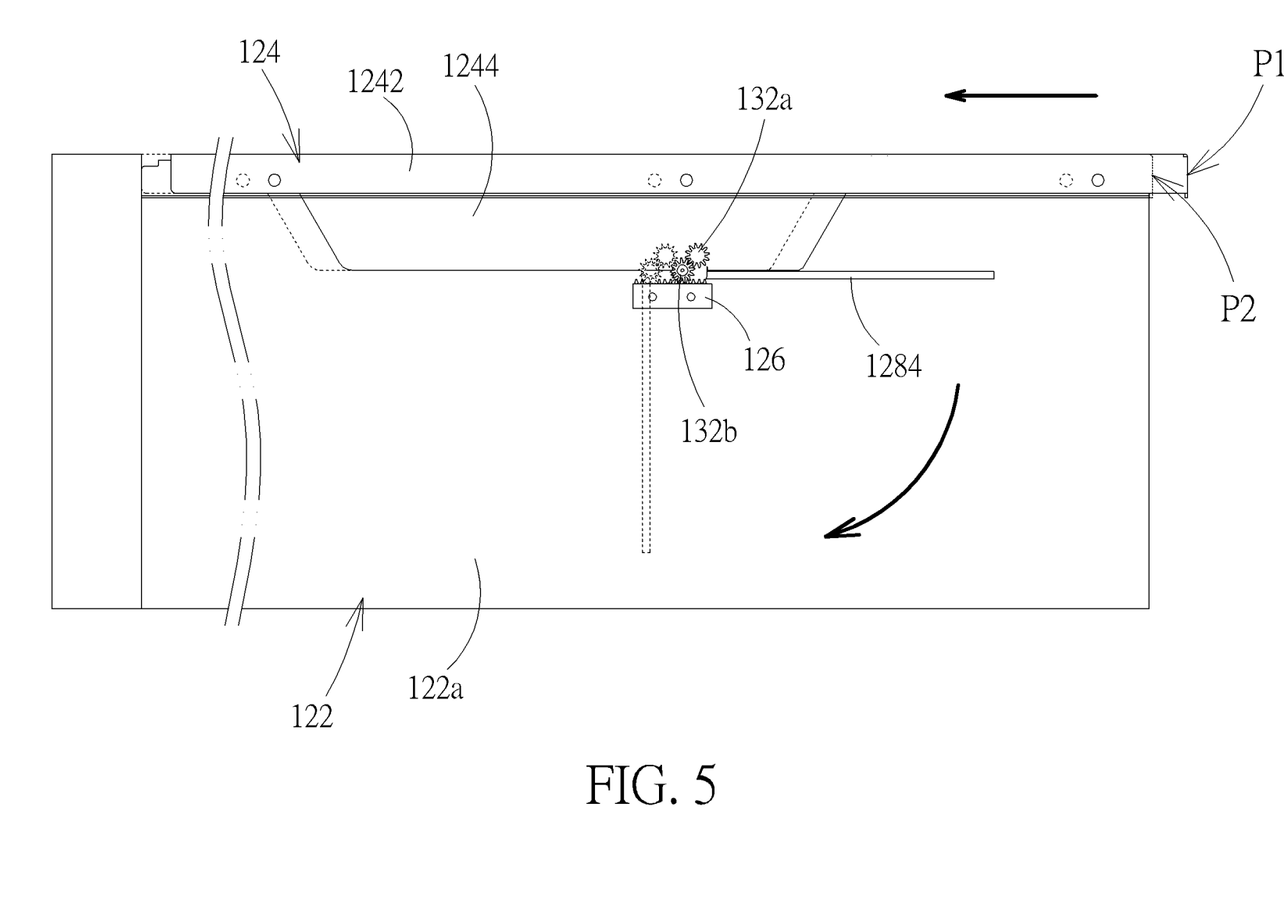
FIG. 5 is a side view of the server in FIG. 1 with the relative movement of the second casing member to the first casing member.

In the embodiment, the first casing member 122 and the second casing member 124 are engaged in a sliding engagement. As shown by FIG. 3, a plurality of sliding slots (not labeled in the figure) are disposed on upper edges of side walls 122a and 122b of the first casing member 122. The second casing member 124 has a plurality of posts (not labeled in the figure) correspondingly, which can slide in the corresponding sliding slots. Please also refer to FIG. 5, which is a side view of the engagement of the second casing member 124 with the first casing member 122; therein, for simplification of description, the portions of the support frame 1244, the driving portion 126, the first gear 132a, the second gear 132b, and the blocking portion 128 which are exposed out of the support frame 1244 are still drawn in solid lines. The second casing member has a first position P1 and a second position P2 relative to the first casing member 122. In the engagement of the second casing member 124 with the first casing member 122, the posts of the second casing member 124 are placed in the sliding slots of the first casing member 122 at first. At the meantime, the second casing member 124 is located at the first position P1 relative to the first casing member 122 (as shown in solid lines in FIG. 5). Then, the second casing member 124 is moved to the second position P2 relative to the first casing member 122 (as shown in dashed lines in FIG. 5); thereby, the engagement of the second casing member 124 with the first casing member 122 is completed and the accommodating space 12a is formed accordingly. In practice, the second casing member 124 and the first casing member 122 can be further fixed with screws. During the sliding movement of the second casing member 124 from the first position P1 to the second position P2, the driving portion 126 connects with the rotary shaft 130, so that the rotary shaft 130 is structurally constrained by the driving portion 126 to rotate to drive the blocking portion 128 to rotate away from the second casing member 124 in the accommodating space 12a. Furthermore, when the second casing member 124 moves from the second position P2 to the first position P1 (e.g. for detaching the second casing member 124 from the first casing member 122), the rotary shaft 130 is structurally constrained by the driving portion 126 to rotate in an opposite direction to drive the blocking portion 128 to rotate toward second casing member 124 in the accommodating space 12a (e.g. until the blocking portion 128 is substantially horizontally disposed), so as for facilitating a detachment of the second casing member 124.

Furthermore, in the embodiment, the driving portion 126 is a gear rack, which is fixed on the side wall 122a. The rotary shaft 130 is connected with the gear rack through the first gear 132a and the second gear 132b. Therein, the first gear 132a is fitted to an end portion of the rotary shaft 130 so that the first gear 132a and the rotary shaft 130 can rotate together. The second gear 132b is pivotally connected to the support frame 1244 and meshes with the first gear 132a and the gear rack (or the driving portion 126) individually; however, the arrangement thereof is not limited thereto in practice. For example, in the view point of FIG. 5, the gear rack can be modified to be disposed above the first gear 132a and mesh with the first gear 132a, and the rotary shaft 130 also can rotate in the same direction. In this case, the second gear 132b can be omitted. For another example, the transmission mechanism between the rotary shaft 130 and the driving portion 126 can be realized by frictional structures (for example but not limited to frictional contact between a surface of rotary shaft 130 with a surface of the driving portion 126) instead of the gear transmission mechanism. Furthermore, in practice, the connection mechanism (or transmission mechanism) between the rotary shaft 130 with driving portion 126 can be designed according to the engagement of the second casing member 124 with the first casing member 122. In principle, any connection mechanism capable of converting the movement of the second casing member 124 relative to the first casing member 122 into the rotation movement of the rotary shaft 130 is acceptable; however, the transmission mechanism is still not limited thereto in practice. Furthermore, in practice, the engagement of the second casing member 124 with the first casing member 122 is not limited to the usage of the posts and the sliding slots. In addition, in the embodiment, when the second casing member 124 is located at the first position P1, the driving portion 126 is just going to touch the rotary shaft 130; however, the engagement thereof is not limited thereto in practice. For example, after the second casing member 124 slides from the first position P1 toward the second position P2 by a small distance, the driving portion 126 starts connecting with the rotary shaft 130. For another example, when the second casing member 124 is located at the first position P1, the driving portion 126 has been connected with the rotary shaft 130 stably (e.g. the second gear 132*b* meshing with the gear rack effectively).

Figure 1:
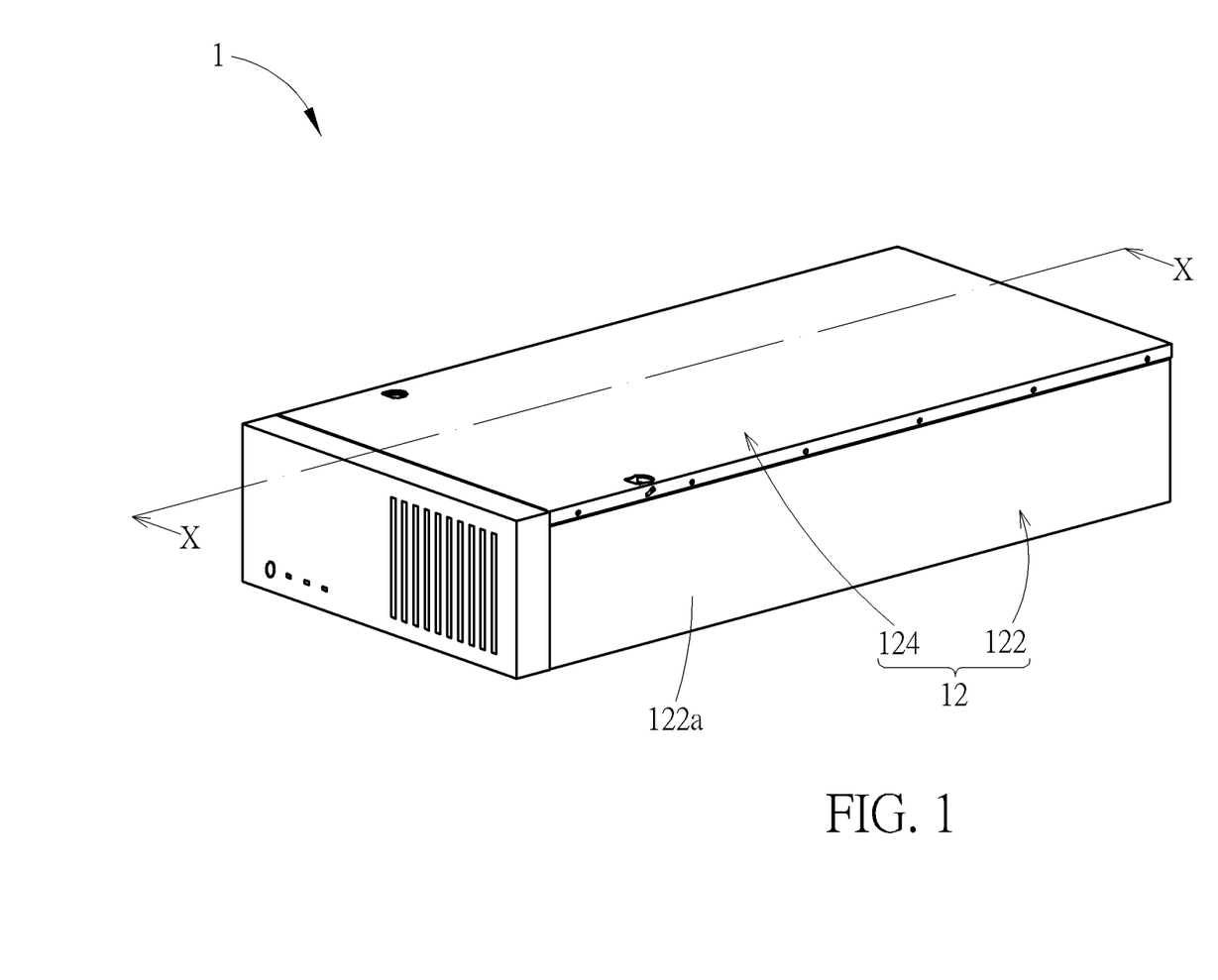
FIG. 1 is a schematic diagram illustrating a server according to an embodiment.
Figure 2:
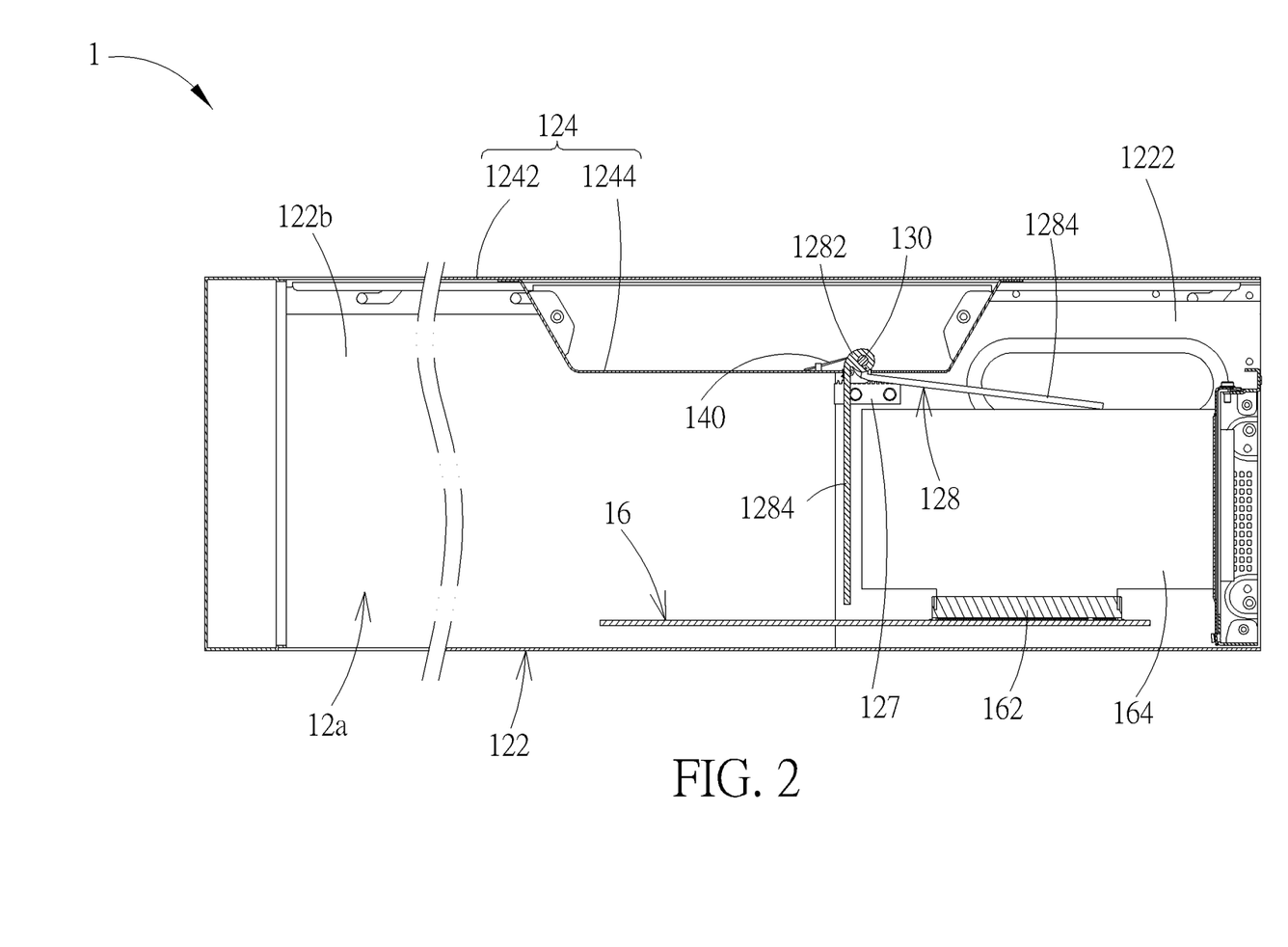
FIG. 2 is a sectional view of the server along the line X-X in FIG. 1.
Figure 6:
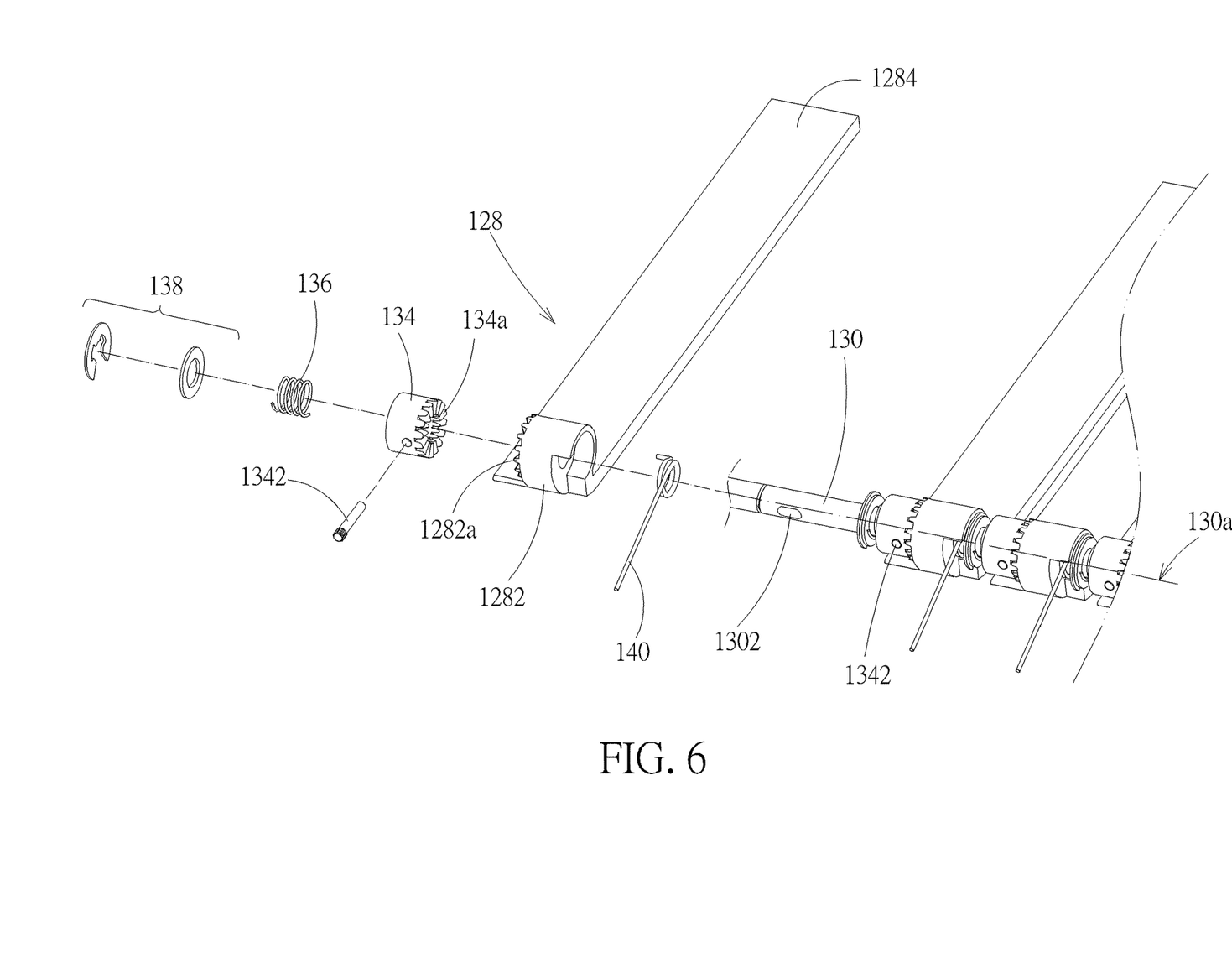
FIG. 6 is a partially exploded view of the connection of the rotary shaft and the blocking portion in FIG. 3.
Figure 7:
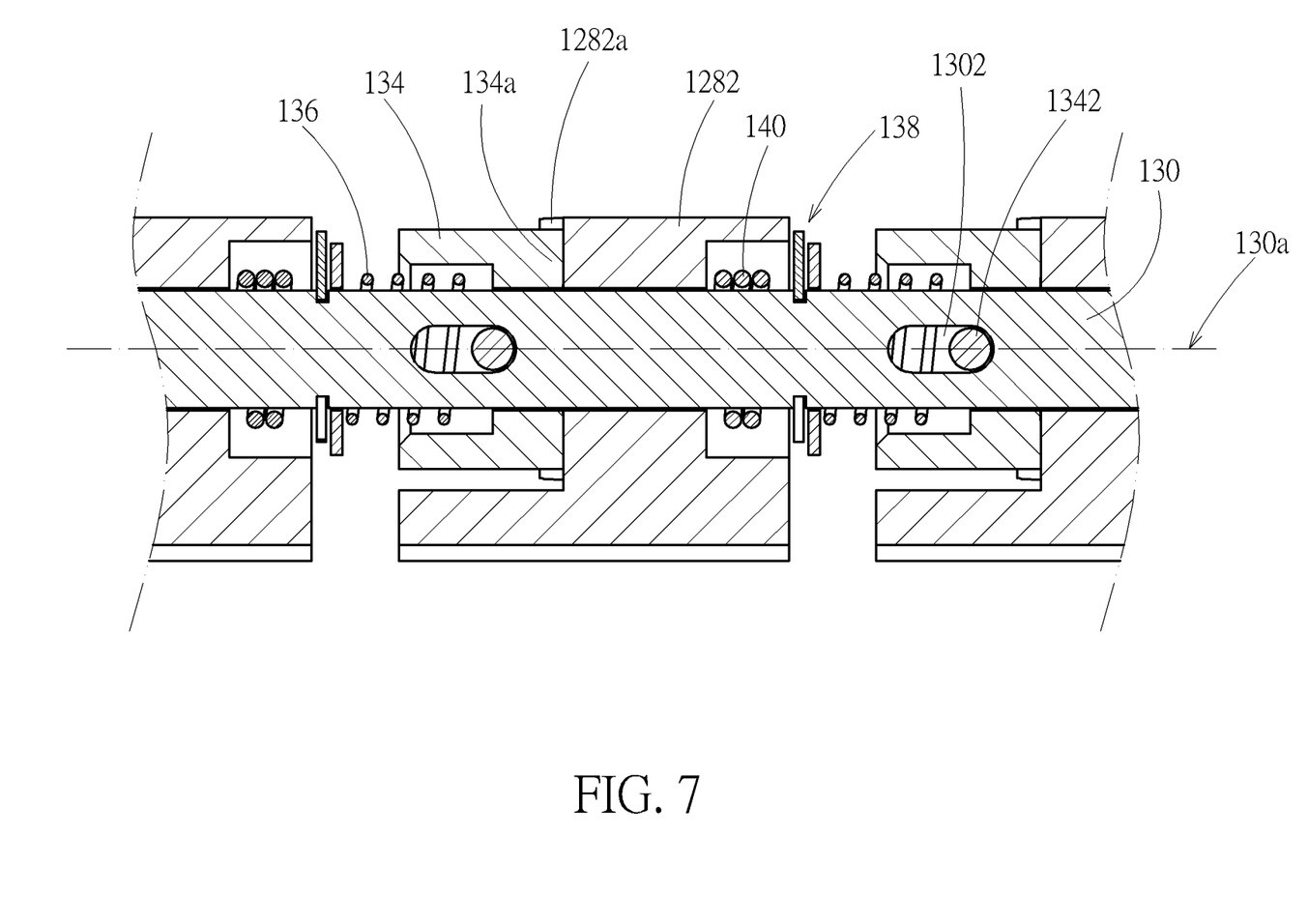
FIG. 7 is a sectional view of the blocking portion and the rotary shaft along the line Y-Y in FIG. 4.

Please also refer to FIG. 6 and FIG. 7. In the embodiment, the apparatus case 12 includes a transmission part 134 corresponding to each blocking portion 128. The rotary shaft 130 is connected to the blocking portion 128 through the corresponding transmission part 134. For detail, the blocking portion 128 includes a base portion 1282 and a plate portion 1284 connected to the base portion 1282. The base portion 1282 is sleeved on the rotary shaft 130 and is rotatable relative to the rotary shaft 130. Because the rotary shaft 130 is pivotally connected to the second casing member 124, in structure logic, the above structural configuration can be regarded as a case that the blocking portion 128 is rotatably disposed on the second casing member 124 through the base portion 1282. The transmission part 134 is slidably connected to the rotary shaft 130 parallel to a rotation axis 130*a* of the rotary shaft 130 (indicated by a chain line in FIG. 6 and FIG. 7). More precisely, in the embodiment, the transmission part 134 is sleeved on the rotary shaft 130 and rotates together with the rotary shaft 130. The base portion 1282 has a first contact structure 1282*a*. The transmission part 134 has a second contact structure 134*a*. The transmission part 134 is driven by the rotary shaft 130 to touch the first contact structure 1282*a* through the second contact structure 134*a* so as to drive the base portion 1282 to rotate (i.e. making the blocking portion 128 rotate). After the second casing member 124 and the first casing member 122 are engaged (i.e. the second casing member 124 being located at the second position P2), the plate portion 1284 will be substantially disposed vertically if the rotation of the plate portion 1284 is not stopped (e.g. no expansion card being inserted in the corresponding expansion slot 162), as shown by FIG. 2. In FIG. 3, a rectangle in dashed lines represents the position of the plate portion 1284 relative to the corresponding expansion slot 162 for this case. Thereby, the plate portion 1284 can retard airflow into the space above the corresponding expansion slot 162, so that the arrangement for the airflow for heat dissipation in the accommodating space 12*a* will not be affected much by the case that no expansion card is inserted in the corresponding expansion slot 162.

Figure 8:
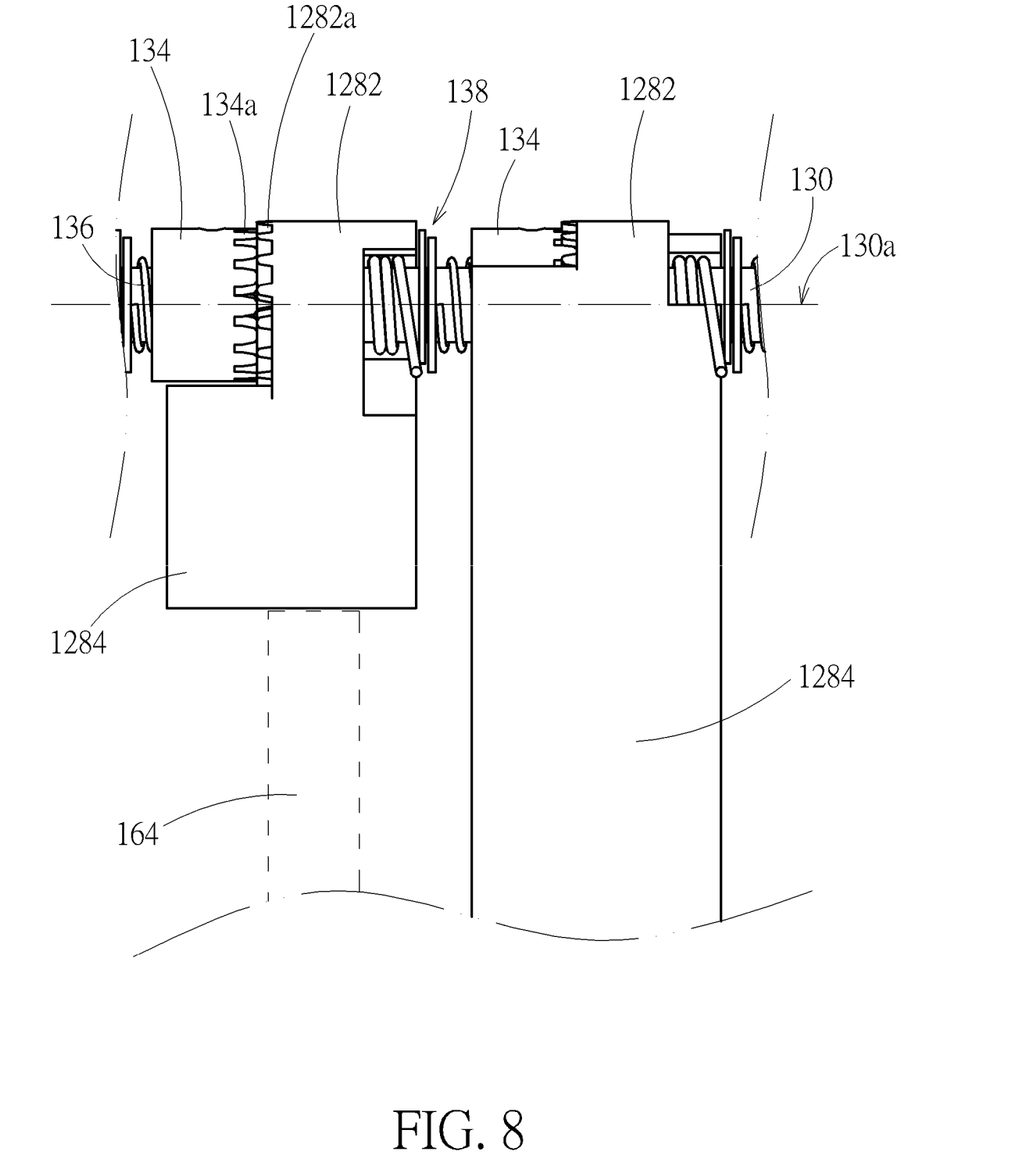
FIG. 8 is a schematic diagram illustrating a relative movement of the blocking portion and a transmission part along a rotation axis.

Furthermore, in the embodiment, the first contact structure 1282*a* and the second contact structure 134*a* are matching crown gears, of which the tooth shape is trapezoid, so when the plate portion 1284 is blocked so that the blocking portion 128 stops rotating relative to the second casing member 124 (e.g. the corresponding expansion slot 162 receiving the expansion card 164, of which an upper edge will prevent the plate portion 1284 from rotating downward), the transmission part 134 will move parallel to the rotation axis 130*a* so that the second contact structure 134*a* and the first contact structure 1282*a* relatively slide so as to make the base portion 1282 not to rotate with the transmission part 134, as shown by FIG. 8 (therein the expansion card 164 being indicated by a rectangle in dashed lines). In practice, the tooth shape of the crown gear also can be a triangle, or the first contact structure 1282*a* and the second contact structure 134*a* are realized by matching cam surfaces or wavy surfaces. The both cases can produce the effect like the above relative slide.

Furthermore, in the embodiment, the apparatus case 12 includes an elastic restoration part 136 corresponding to each transmission part 134. The elastic restoration part 136 is connected to the corresponding transmission part 134 for forcing the transmission part 134 to make the second contact structure 134*a* keep touching the first contact structure 1282*a*. Thereby, when the plate portion 1284 is not blocked any longer, the elastic restoration part 136 can drive the transmission part 134 to mesh with the base portion 1282 again so as to rotate together. In the embodiment, the apparatus case 12 includes a retainer 136 (for example but not limited to an E-shaped retaining ring with a washer) corresponding to each transmission part 134. The retainer 136 is disposed on the rotary shaft 130. The elastic restoration part 136 is a spiral spring which is sleeved on the rotary shaft 130 and abuts against and between the retainer 136 and the transmission part 134; however, the structural configuration is not limited thereto in practice. For example, an end portion of the elastic restoration part 136 is fixed on the rotary shaft 130 (e.g. by inserting an end of the spiral spring into a radial hole of the rotary shaft 130); another end portion thereof abuts against the transmission part 134. For this case, the retainer 136 can be omitted. For another example, the two end portions of the elastic restoration part 136 abut against and between the corresponding transmission part 134 and the adjacent blocking portion 128. For this case, the retainer 136 also can be omitted. For another example, the elastic restoration part 136 can be realized by a spring of other types (e.g. a spring washer, a cylinder made of elastic material) or other structures capable of providing restoration force to the blocking portion 128.

Furthermore, in the embodiment, the rotary shaft 130 and the transmission part 134 rotate together through the coordination of the sliding slot and the sliding block. For detail, the rotary shaft 130 has a sliding slot 1302 which extends parallel to the rotation axis 130*a*. The transmission part 134 has a sliding block 1342. The sliding block 1342 is relatively slidably disposed in the sliding slot 1302, so that the transmission part 134 can slide relative to the rotary shaft 130 parallel to the rotation axis 130*a* and the rotary shaft 130 can drive the transmission part 134 through the sliding block 1342 to rotate together. Furthermore, in the embodiment, the sliding slot 1302 is realized by a through slot. The sliding block 1342 is realized by an insertion pin which is inserted into the transmission part 134. However, the structural configuration is not limited thereto in practice. For example, the sliding slot is disposed on (the inner wall of a through hole of) the transmission part 134; the sliding block is disposed on the rotary shaft 130. For another example, the transmission part 134 uses a non-circle hole thereof (e.g. a square or polygon) to be sleeved on a shaft portion of the rotary shaft 130 with a non-circle sectional profile. Furthermore, in the embodiment, the elastic restoration part 136 abuts against and between the retainer 136 and the sliding block 1342 (i.e. the insertion pin). In addition, in the embodiment, the blocking portion 128 and the transmission part 134 are sleeved on the rotary shaft 130; however, the structural configuration is not limited thereto in practice. For example, the blocking portions 128 and the transmission parts 134 are staggered relative to the rotation axis 130*a* and pivotally connected to the second casing member 124 individually. The rotary shaft 130 and the transmission part 134 can be connected by a gear mechanism or a belt in coordination with a belt pulley. For another example, the blocking portion 128, the transmission part 134, and the rotary shaft 130 are coaxially disposed. The transmission part 134 and the rotary shaft 130 are connected in a similar way to the connection of the first gear 132*a* and the rotary shaft 130; therein, the transmission part 134 still can slide relative to the rotary shaft 13 parallel to the rotation axis 130*a*.

Furthermore, in the embodiment, the apparatus case 12 includes an elastic restoration part 140 corresponding to each blocking portion 128. The elastic restoration part 140 is connected to the corresponding blocking portion 128 and the second casing member 124, so as to drive the blocking portion 128 to rotate toward the second casing member 124. In other words, during the detachment of the second casing member 124 from the first casing member 122, the blocking portion 128 can be as against the second casing member 124 as possible. In the embodiment, the elastic restoration part 140 is a torque spring, which is sleeved on the rotary shaft 130, and of which two ends are connected to the second casing member 124 and the blocking portion 128 respectively. In practice, the elastic restoration part 140 also can be realized by a spiral spring, which is connected to and between the second casing member 124 and the plate portion 1284 of the blocking portion 128. In addition, in principle, the choice of the elastic restoration part 140 is based on that the elastic restoration part 140 can overcome the rotation of the plate portion 1284 due to the weight of the plate portion 1284 and will not influence on the rotary shaft 130 to drive the blocking portion 128 through the transmission part 134.

In addition, as shown by FIG. 3, in the embodiment, the first casing member 122 includes a power supply fixing frame 1222, which is disposed close to the side wall 122b for fixing a power supply (not shown in the figure). The apparatus case 12 also includes a driving portion 127 disposed on the power supply fixing frame 1222. During the movement of the second casing member 122 from the first position P1 to the second position P2 relative to the first casing member 124, two end portions of the rotary shaft 130 simultaneously connect with the driving portions 126 and 127 respectively. This structural configuration can make the rotary shaft 130 sustain symmetric driving forces. For simplification of description, the driving portion 127 is realized by a gear rack and is connected with the rotary shaft 130 through a gear set. Therefore, for other descriptions about the connection structure between the driving portion 127 and the rotary shaft 130, please refer to the relevant descriptions of the driving portion 126 and the connection structure between the driving portion 126 and the rotary shaft 130, which will not be described in addition. However, the structural configuration thereof is not limited thereto in practice. In addition, in practice, the driving portion 127 also can be disposed on the side wall 122b (e.g. for a case that the power supply fixing frame 1222 is not disposed there). Furthermore, in practice, it is applicable to use either the driving portion 126 or the driving portion 127 for effectively driving the rotary shaft 130 to rotate.

In addition, the above apparatus case 12 is illustrated by the apparatus case of a server; however, any apparatus case that includes separable casing members is applicable. For example, for a common computer host that includes a main board with a plurality of expansion slots, the blocking portion 128 can be used for selectively retarding airflow into the space above the corresponding expansion slot, so that the arrangement for the airflow in the computer host will not be affected much due to an absence of an expansion card inserted in the corresponding expansion slot.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. An apparatus case, comprising:
  a first casing member;
  a second casing member, detachably and slidably engaged with the first casing member;
  a driving portion, disposed on the first casing member;
  a blocking portion, rotatably disposed on the second casing member; and
  a rotary shaft, rotatably disposed on the second casing member and connected to the blocking portion;
wherein the second casing member has a first position and a second position relative to the first casing member, and when the second casing member slides from the first position to the second position, the driving portion drives the rotary shaft to rotate so that the rotary shaft drives the blocking portion to rotate.

2. The apparatus case according to claim 1, wherein the driving portion is a gear rack, the rotary shaft and the driving portion are connected by at least one gear, and the at least one gear is rotatably disposed on the second casing member.

3. The apparatus case according to claim 2, wherein the at least one gear comprises a first gear and a second gear, the first gear and the rotary shaft are connected, and the second gear is rotatably disposed on the second casing member and meshes with the first gear and the gear rack.

4. The apparatus case according to claim 1, further comprising a transmission part and an elastic restoration part, wherein the blocking portion comprises a base portion and a plate portion connected to the base portion, the blocking portion is rotatably disposed on the second casing member through the base portion, the base portion has a first contact structure, the transmission part is slidably connected to the rotary shaft parallel to a rotation axis of the rotary shaft, the transmission part has a second contact structure, the elastic restoration part is connected to the transmission part so as to drive the second contact structure to keep touching the first contact structure, and the transmission part is driven by the rotary shaft to rotate the base portion.

5. The apparatus case according to claim 4, wherein when the plate portion is blocked so that the blocking portion stops rotating relative to the second casing member, the transmission part moves parallel to the rotation axis so that the second contact structure and the first contact structure relatively move.

6. The apparatus case according to claim 4, wherein the transmission part is sleeved on the rotary shaft, and the elastic restoration part is connected to and between the transmission part and the rotary shaft.

7. The apparatus case according to claim 6, wherein one of the transmission part and the rotary shaft has a sliding slot, the sliding slot extends parallel to the rotation axis, the other of the transmission part and the rotary shaft has a sliding block, and the sliding block is relatively slidably disposed in the sliding slot.

8. The apparatus case according to claim 6, wherein the base portion is sleeved on the rotary shaft and is rotatable relative to the rotary shaft.

9. The apparatus case according to claim 4, wherein the first contact structure and the second contact structure are matching crown gears or cam surfaces.

10. The apparatus case according to claim 1, further comprising an elastic restoration part, the elastic restoration part being connected to the blocking portion and the second casing member so as to drive the blocking portion to rotate toward the second casing member.

11. A server, comprising:
  an apparatus case, comprising:
    a first casing member;
    a second casing member, detachably engaged with the first casing member;
    a driving portion, disposed on the first casing member;

a blocking portion, rotatably disposed on the second casing member; and a rotary shaft, rotatably disposed on the second casing member and connected to the blocking portion; and a circuit board, disposed on the first casing member and comprising an expansion slot;

wherein the second casing member has a first position and a second position relative to the first casing member, and when the second casing member moves from the first position to the second position, the driving portion drives the rotary shaft to rotate so that the rotary shaft drives the blocking portion to rotate above the expansion slot.

12. The server according to claim 11, wherein the driving portion is a gear rack, the rotary shaft and the driving portion are connected by at least one gear, and the at least one gear is rotatably disposed on the second casing member.

13. The server according to claim 11, wherein the apparatus case further comprises a transmission part and an elastic restoration part, the blocking portion comprises a base portion and a plate portion connected to the base portion, the blocking portion is rotatably disposed on the second casing member through the base portion, the base portion has a first contact structure, the transmission part is slidably connected to the rotary shaft parallel to a rotation axis of the rotary shaft, the transmission part has a second contact structure, the elastic restoration part is connected to the transmission part so as to drive the second contact structure to keep touching the first contact structure, the transmission part is driven by the rotary shaft to rotate the base portion.

14. The server according to claim 13, wherein when the plate portion is blocked so that the blocking portion stops rotating relative to the second casing member, the transmission part moves parallel to the rotation axis so that the second contact structure and the first contact structure relatively move.

15. The server according to claim 13, wherein the transmission part is sleeved on the rotary shaft, and the elastic restoration part is connected to and between the transmission part and the rotary shaft.

16. The server according to claim 15, wherein one of the transmission part and the rotary shaft has a sliding slot, the sliding slot extends parallel to the rotation axis, the other of the transmission part and the rotary shaft has a sliding block, and the sliding block is relatively slidably disposed in the sliding slot.

17. The server according to claim 15, wherein the base portion is sleeved on the rotary shaft and is rotatable relative to the rotary shaft.

18. The server according to claim 13, wherein the first contact structure and the second contact structure are matching crown gears or cam surfaces.

19. The server according to claim 11, wherein the apparatus case further comprises an elastic restoration part, and the elastic restoration part is connected to the blocking portion and the second casing member so as to drive the blocking portion to rotate toward the second casing member.

20. The server according to claim 11, wherein the first casing member comprises a power supply fixing frame, and the driving portion is disposed on the power supply fixing frame.

* * * * *